(12) United States Patent
Zhang et al.

(10) Patent No.: US 6,687,322 B1
(45) Date of Patent: Feb. 3, 2004

(54) DUAL MODE CLOCK ALIGNMENT AND DISTRIBUTION DEVICE

(75) Inventors: Yuheng Zhang, Cupertino, CA (US); Christopher Burns, San Jose, CA (US); Martin L. Ngu, Newark, CA (US)

(73) Assignee: Adaptec, Inc., Milpitas, CA (US)

( * ) Notice: Subject to any disclaimer, the term of this patent is extended or adjusted under 35 U.S.C. 154(b) by 605 days.

(21) Appl. No.: 09/680,918

(22) Filed: Oct. 6, 2000

(51) Int. Cl.[7] .................................................. H03D 3/24
(52) U.S. Cl. ...................................................... 375/376
(58) Field of Search ................................. 375/376, 354; 331/2, 8, 1 R, 10, 17, 25, 34, 1 A; 327/147–150, 156–159

(56) References Cited

U.S. PATENT DOCUMENTS 5,463,353 A * 10/1995 Countryman et al. .......... 331/2
5,579,353 A * 11/1996 Parmenter et al. .......... 375/376

* cited by examiner

*Primary Examiner*—Don N. Vo
(74) *Attorney, Agent, or Firm*—Martine & Penilla, LLP (57) ABSTRACT

The present invention provides a dual mode clock alignment device including a clock buffer cell, a PLL, and a first set and second set of buffers. The clock buffer cell is arranged to receive a first clock and delays the first clock. The PLL is arranged to receive the delayed first clock from the clock buffer and outputs a second clock. The first and second sets of buffers are arranged to receive the delayed first clock from the clock buffer cell for operating in a first clock mode. The first and second sets of buffers are further arranged to receive the second clock from the PLL for operating in a second clock mode. In this arrangement, the first set of buffers delays the received clock by a first delay to output a third clock and the second set of buffers delays the delayed clock by a second delay to output a fourth clock. When operating in the second clock mode, the first, third, and fourth clocks are all aligned.

26 Claims, 6 Drawing Sheets

DUAL MODE CLOCK ALIGNMENT AND DISTRIBUTION DEVICE

BACKGROUND OF THE INVENTION

1. Field of the Invention

This invention relates generally to clock alignment devices, and more particularly to clock alignment devices that can operate in dual modes.

2. Description of the Related Art

Clocking devices play an integral part in most modern electronic systems. In synchronous systems, in particular, clocking devices are used to step desired system operations through various stages of signal processing. For example, modem computer systems typically employ clock devices to synchronize transfer and processing of data and control signals between various parts of the computer systems.

Computer systems generally include one or more central processing units (CPUs), a main memory, input/output (I/O) devices, mass storage devices (e.g., hard disks, optical disk drives, etc.), and one or more buses. The buses function to facilitate communication of data and control signals among the various components of a computer system. Some popular buses used in modem computer systems are peripheral component interface (PCI) bus, IDE bus, SCSI bus, etc.

Figure 1:
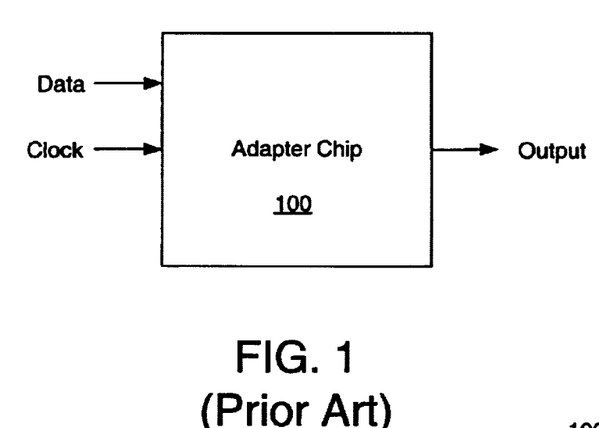
FIG. 1 shows a PCI adapter for interfacing a computer component device or digital device with a PCI bus.

The PCI bus, for example, is widely used to connect an increasing number of component devices in accordance with conventional PCI specification version 2.2. To facilitate communication, PCI adapters are typically implemented in such computer systems to properly synchronize communication and processing of the data and control signals between a bus and a computer component device. FIG. 1 shows a PCI adapter 100 for interfacing a computer component device or digital device with a PCI bus. The PCI adapter 100 receives data signals (e.g., data, address, etc.) and a clock signal, which runs at the maximum clock speed of 66 Mhz. This translates to a clock period of 15 nanosecond (ns). The PCI adapter 100 processes the data signals and generates output signals. In this arrangement, however, the output signals are generated and output after a propagation delay typically ranging between 2 to 6 ns.

Figure 2A:
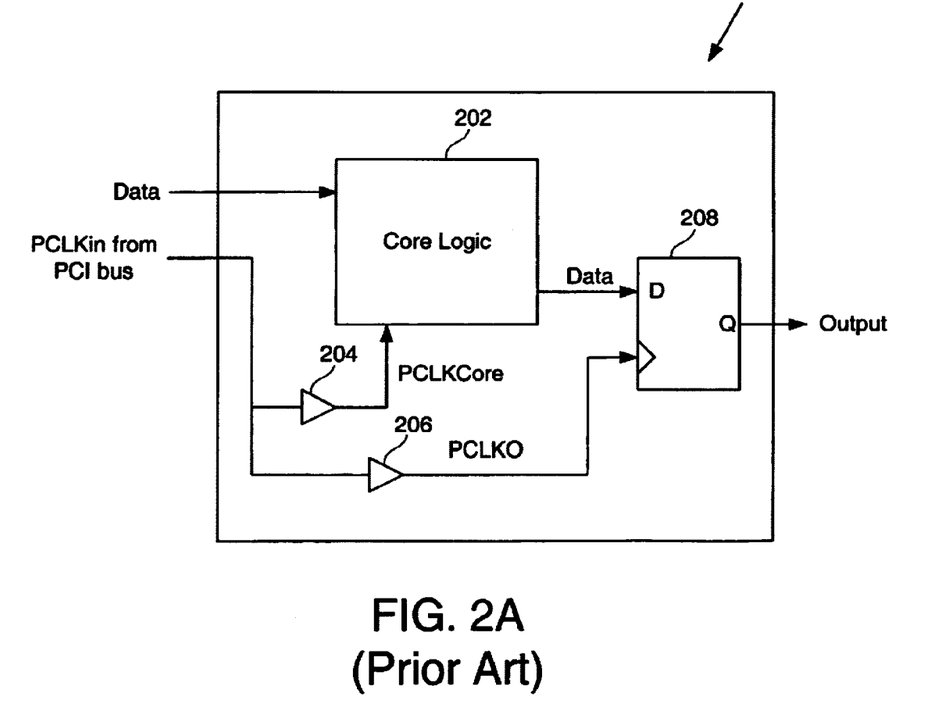
FIG. 2A illustrates a more detailed schematic diagram of the PCI adapter.

FIG. 2A illustrates a more detailed schematic diagram of the PCI adapter 100. The PCI adapter 100 includes core logic 202, a flip-flop 208, and a pair of delay elements 204 and 206. The delay elements 204 and 206 receive input reference clock PCLKin from a PCI bus (not shown) and outputs delayed clocks PCLKCore and PCLKO, respectively. The PCLKCore clock is then provided to the core logic 202 to synchronize the operation of the core logic 202. Similarly, the PCLKO clock is provided as a control clock to the flip-flop 208. The core logic 202 interfaces data received from the PCI bus and outputs the data to the flip-flop 208 in response to the PCLKCore clock. The flip-flop 208 then outputs the data in response to the PCLKO clock.

Figure 2B:
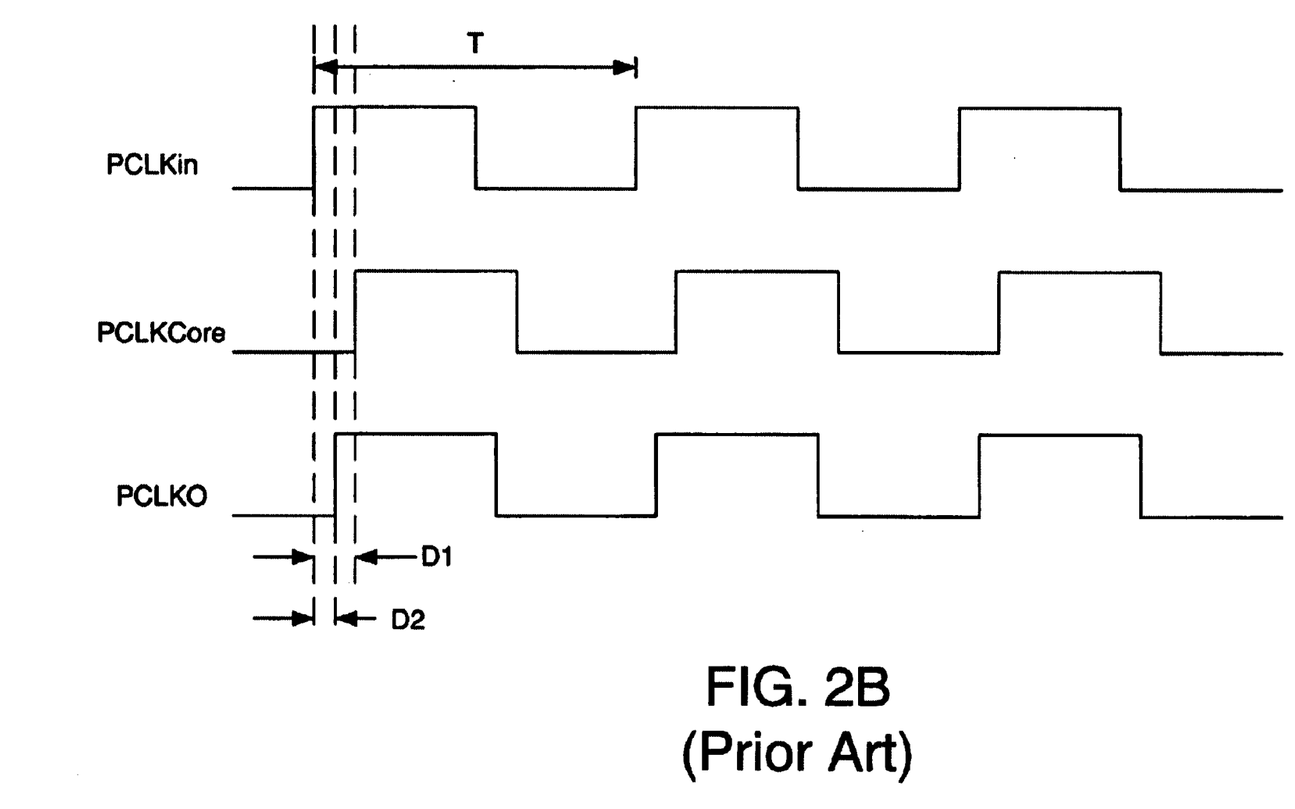
FIG. 2B shows a timing diagram of PCLKCore and PCLKO clocks of the PCI adapter for an input PCLKin clock of 66 Mhz.

In operation, however, the use of delay elements 204 and 206 typically generates a clock skew. For example, FIG. 2B shows a timing diagram of clocks PCLKCore and PCLKO of the PCI adapter 100 for PCLKin clock of 66 Mhz. The reference clock PCLKin is characterized by a period T of 15 ns. The delay element 204 delays the PCLKin clock and outputs PCLKCore with 5 ns delay D1 to the core logic 202. This delay allows the input data signal to settle for transmission to the core logic 202. On the other hand, the delay element 206 is typically configured to provide substantially less delay than the delay element 204. For example, the delay element 206 delays the PCLKin clock and outputs PCLKO with 2 ns delay D2 to the output flip-flop.

While the delays D1 and D2 are suitable for conventional PCI specification version 2.2, these delays generally are not adequate for clock speed higher than 66 Mhz. For example, a latest enhancement to the conventional PCI protocol, specified as an addendum to PCI local bus specification version 2.2 and commonly known as PCI-X specification, which is incorporated herein by reference, allows clock speed of up to 133 Mhz. At 133 Mhz clock speed, the PCI adapter 100 would not provide sufficient clock margins to allow proper operation. Specifically, as the reference clock speed increases up to 133 Mhz with a period of 7.5 ns, the delays D1 and D2 of 5 ns and 2 ns become more significant. However, the PCI-X specification requires data output delay between ½ ns and 4 ns relative to the input clock PCLKin. With such large delays with respect to the reference clock, PCLKCore and PCLKO clock signals may not align properly with sufficient margins to allow the host adapter to generate proper output signals for PCI-X devices.

Thus, there is a need for clocking devices that can ensure proper operation of PCI devices in both conventional PCI mode and the newer PCI-X mode. In addition, what is also needed is clocking alignment and distribution devices that can accommodate different clock speeds with minimum clock skews.

SUMMARY OF THE INVENTION

The present invention fills these needs by providing dual mode clock alignment and distribution devices. It should be appreciated that the present invention can be implemented in numerous ways, including as a process, an apparatus, a system, a device, a method, or a computer readable medium. Several inventive embodiments of the present invention are described below.

In one aspect of the invention, the present invention provides a dual mode clock alignment device including a clock buffer cell, a phase-lock loop (PLL), and a first set and second set of buffers. The clock buffer cell is arranged to receive a first clock and delays the first clock. The PLL is arranged to receive the delayed first clock from the clock buffer and outputs a second clock. The first and second sets of buffers are arranged to receive the delayed first clock from the clock buffer cell for operating in a first clock mode. The first and second sets of buffers are further arranged to receive the second clock from the PLL for operating in a second clock mode. In this arrangement, the first set of buffers delays the received clock by a first delay to output a third clock and the second set of buffers delays the delayed clock by a second delay to output a fourth clock. When operating in the second clock mode, the first, third, and fourth clocks are all aligned.

In another aspect of the invention, the present invention provides a dual mode PCI adapter device for interfacing between a PCI bus and a PCI device. The PCI adapter device includes a clock buffer cell, a PLL, a first and second set of buffers, a core logic, and an output flip-flop. The clock buffer cell is arranged to receive and delay a first clock. The PLL arranged to receive the delayed first clock from the clock buffer, the PLL being configured to output a second clock. The first and second sets of buffers are arranged to receive the delayed first clock from the clock buffer cell for operating in a PCI mode. In addition, the first and second sets of buffers are further arranged to receive the second clock from the PLL for operating in a PCI-X mode. The first set of buffers delays the received clock by a first delay to output a third clock and the second set of buffers delays the received clock by a second delay to output a fourth clock. When operating in the PCI-X mode, the first, third, and fourth clocks are all aligned. The core logic includes a set of flip-flops and is arranged to receive and output data and address from the PCI bus in response to the third clock. The output flip-flop is coupled to receive the data from the logic circuit to output the data to the PCI device in response to the fourth clock.

In yet another aspect of the invention, a dual mode clock alignment and distribution device is disclosed. The dual mode clock alignment and distribution device includes a clock buffer cell, a PLL, a first and second set of buffers, a logic circuit, and a set of I/O cells. The clock buffer cell is adapted to receive and delay a first clock. The PLL is arranged to receive the delayed first clock from the clock buffer and output a second clock. The first set and a second set of buffers are arranged to receive the delayed first clock from the clock buffer cell for operating in a first clock mode. The first and second sets of buffers are further arranged to receive the second clock from the PLL for operating in a second clock mode. In this configuration, the first set of buffers delays the received clock by a first delay to output a third clock and the second set of buffers delays the delayed clock by a second delay to output a fourth clock. When operating in the second clock mode, the third and fourth clocks are aligned to the first clock. The logic circuit includes a set of flip-flops and is arranged to receive and output data and address in response to the third clock. The set of I/O cells are coupled to receive the data and address from the logic circuit to output the data and address in response to the fourth clock.

In the higher clocking mode such as PCI-X mode, the dual mode clock alignment and distribution devices use the PLL to provide aligned clocks. On the other hand, when operating in a lower clock speed mode such as conventional PCI mode, the clock alignment and distribution devices bypasses the PLL and generates clocks with sufficient margin to accommodate the requirements of the PCI mode. In this manner, the clock alignment and distribution devices support both lower speed PCI clocking mode and the higher speed PCI-X clocking mode. The clock alignment and distribution devices thus provide full backward compatibility with conventional PCI devices. The dual mode clock alignment and distribution devices thus provide substantial savings in cost while reducing circuit complexity. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

The present invention, dual mode clock alignment and distribution devices, is described. It will be obvious, however, to one skilled in the art, that the present invention may be practiced without some or all of these specific details. In other instances, well known process operations have not been described in detail in order not to unnecessarily obscure the present invention.

The present invention provides synchronous clock alignment and distribution devices that can operate in dual modes to accommodate different clock requirements. In one embodiment, the synchronous clock alignment and distribution device is a PCI adapter that can be used with both conventional PCI devices and PCI-X devices. Although the present invention is illustrated using dual clocking modes of PCI and PCI-X, it is equally suitable for any synchronous clock alignment and distribution devices that require different clock speed and alignment requirements.

Figure 3:
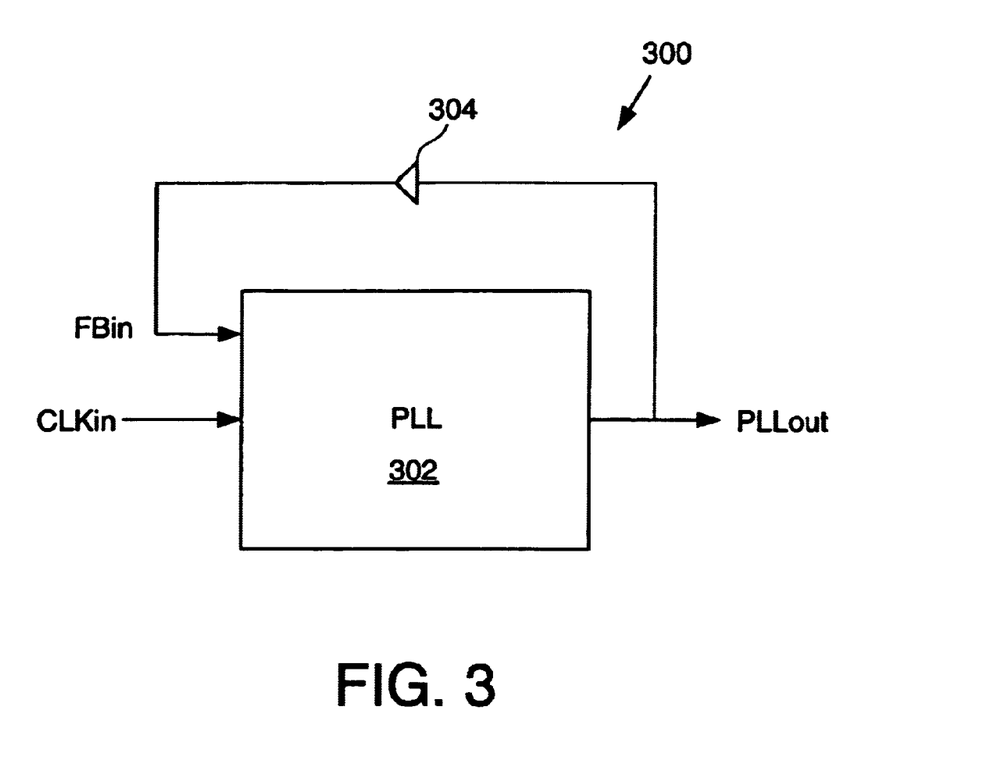
FIG. 3 shows a schematic block diagram of a PLL circuit for aligning an output clock PLLout to an input reference clock CLKin.

The synchronous clock alignment and distribution devices of the present invention employs a phase-lock loop (PLL), preferably a spread spectrum PLL, to accommodate the higher clock requirements, for example, of PCI-X devices. FIG. 3 shows a schematic block diagram of a PLL circuit 300 for aligning an output clock PLLout to an input reference clock CLKin. The PLL circuit 300 includes a PLL 302 and one or more buffers 304. The PLL 302 receives the input clock CLKin and outputs the PLLout signal, which is fed into the buffer 304. The buffer 304 is coupled in a feedback arrangement to the PLL 302 and provides a desired (negative) delay to the PLLout signal because Fbin and CLKin are to be aligned. In response to the inputs CLKin and feedback PLLout signals, the PLL 302 functions to adjust the output phase of the PLLout signal so that the PLLout signal is aligned with the input clock CLKin.

Figure 4:
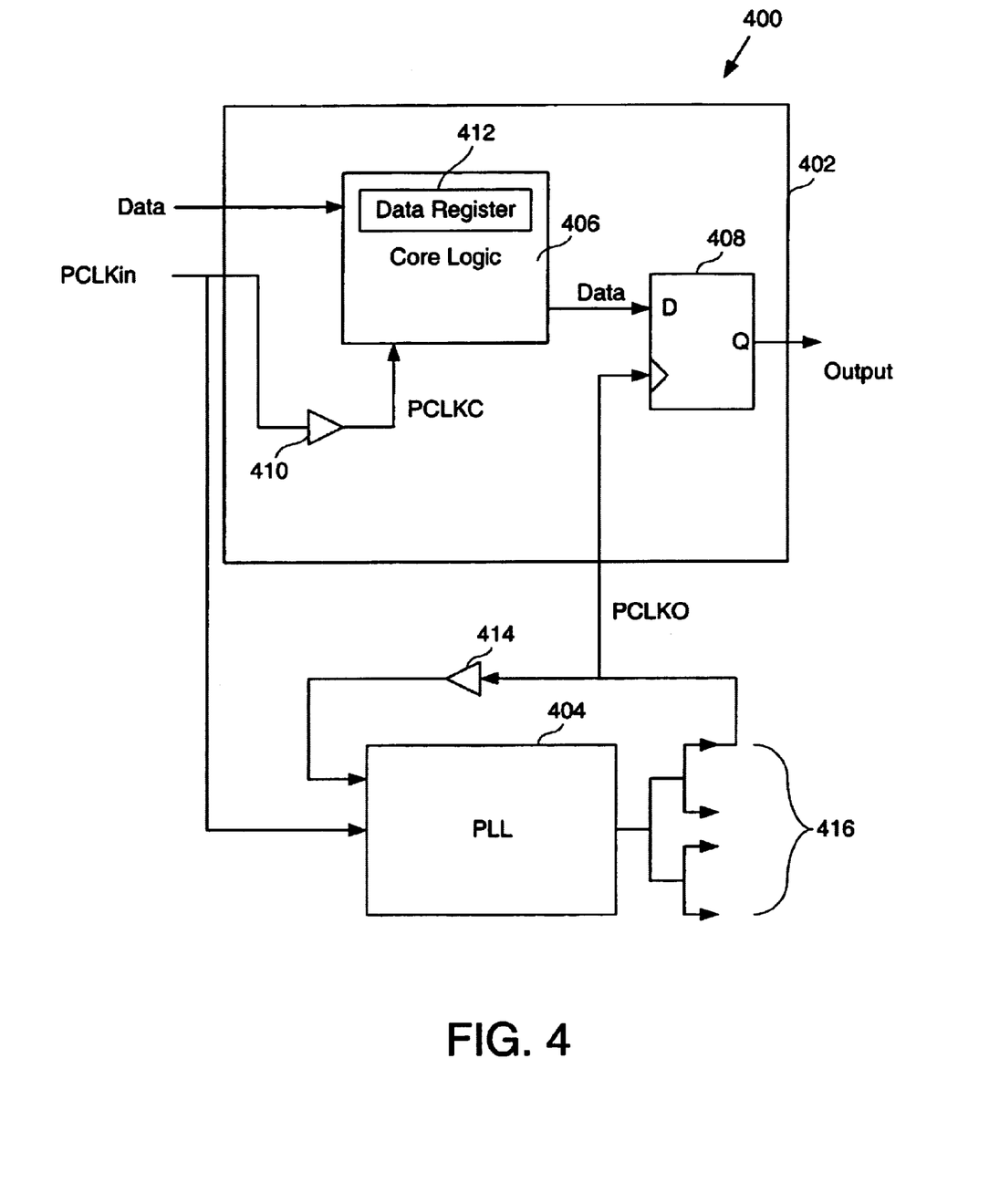
FIG. 4 shows a simplified schematic block diagram of an exemplary PCI adapter that incorporates a PLL in accordance with one embodiment of the present invention.

FIG. 4 shows a simplified schematic block diagram of an exemplary PCI adapter 400 that incorporates a PLL 404 in accordance with one embodiment of the present invention. The dual mode PCI adapter 400 includes a PCI adapter circuitry 402 and the PLL 404. The PCI adapter circuitry 402 includes a core logic 406, an output flip-flop 408, and a delay element 410. The core logic 406 is configured to interface between the PCI bus and a PCI device. For interfacing data, the core logic 406 receives input data such as data, address, and control signals for storage in one or more data registers 412.

The delay element 410 receives input reference clock PCLKin from a PCI bus (not shown) and outputs a delayed clock PCLKC. The PCLKC clock is then provided to the core logic 406 to synchronize the operation of the core logic 406. That is, the core logic 406 outputs the data from the register 412 to the output flip-flop 408 synchronized to the PCLKC clock.

The PLL 404 receives the PCLKin clock and outputs PCLKO clock, which is fed back into the PLL 404 via a delay element 414, which delays the PCLKO clock for input to the PLL 404. In this manner, the PLL 404 functions to align the delayed PCLKO clock from the delay element 414 to the input PCLKin clock. The output PCLKO clock is then provided to the output flip-flop 408, which outputs the data from the core logic 406 in response. The output clock PCLKO may also be provided to other I/O flip-flips or flip-flops in the core logic 406 via a clock distribution tree 416.

Figure 5:
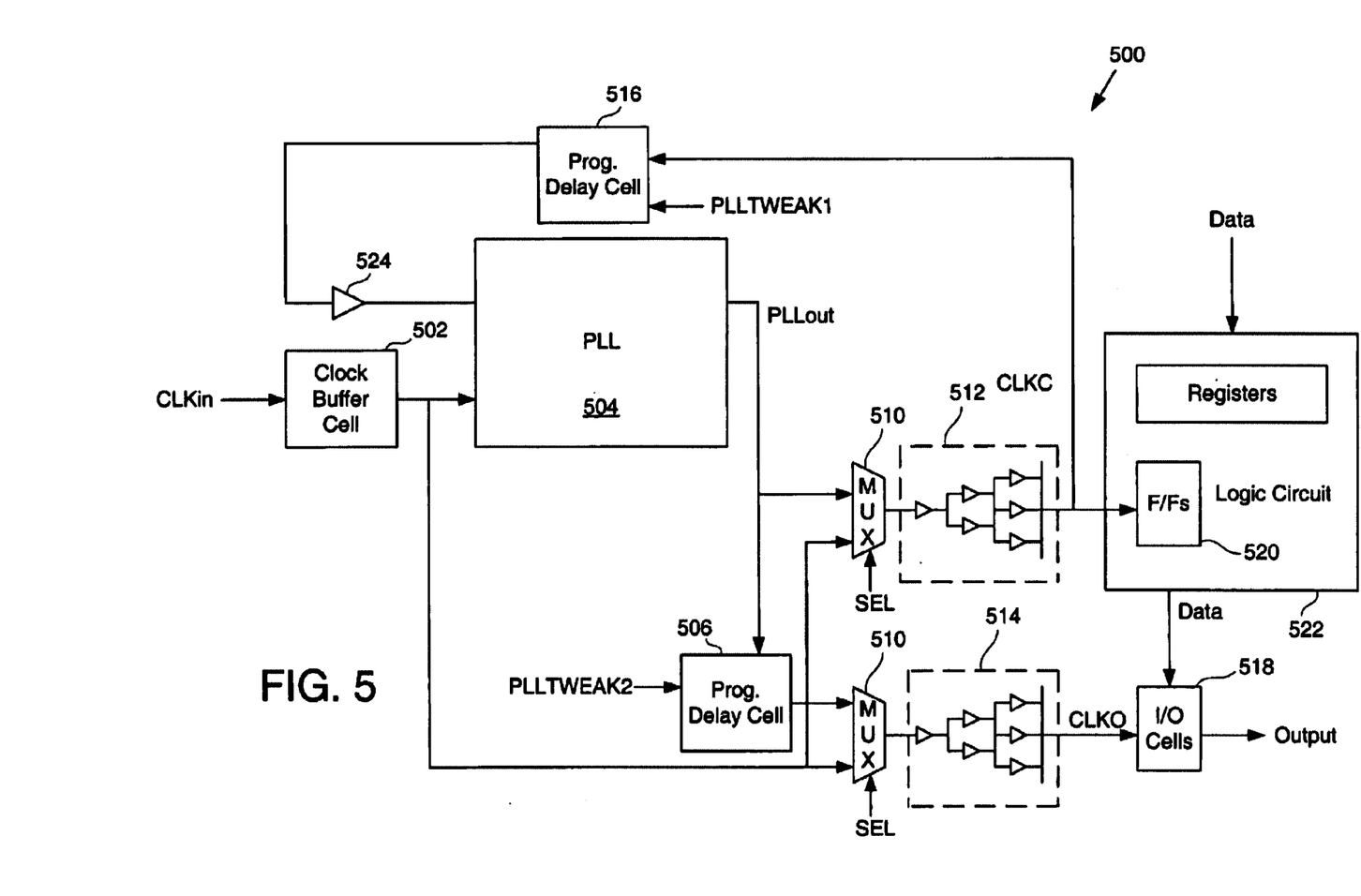
FIG. 5 shows an exemplary dual mode synchronous clock alignment and distribution device in accordance with one embodiment of the present invention.

FIG. 5 shows an exemplary dual mode synchronous clock alignment and distribution device 500 in accordance with one embodiment of the present invention. In the dual mode synchronous clock alignment and distribution device 500, a clock buffer cell 502 (e.g., delay element, latch, flip-flop, buffer, etc.) receives and buffers an input clock CLKin with a specified delay. The delayed CLKin is then provided to a PLL 504 and a pair of multiplexers 508 and 510 as an input. The PLL 504 outputs a PLLout signal, which is fed into the multiplexer 508 and a programmable delay cell 506.

The clock alignment and distribution device 500 operates in a dual mode to accommodate different clock speed requirements. Specifically, the dual mode clock alignment and distribution device 500 uses a select signal SEL to indicate either a high or low clock mode. For example, when the select signal SEL is asserted, it indicates a lower clock speed such as conventional PCI mode of up to 66 Mhz. On the other hand, the SEL signal is deasserted, it indicates a higher clock speed such as PCI-X clock speed of up to 133 Mhz.

The multiplexer 508 receives the SEL signal to select either the PLLout signal from the PLL 504 or the delayed clock from the clock buffer cell 502. In response to the SEL signal, the multiplexer 508 outputs one of the signals to a first set of buffers 512, preferably in a clock tree distribution arrangement, that provides a specified delay to the output signal. For example, the set of buffers 512 provides a delay of 5 ns to the selected signal. The buffers 512 then output the delayed signal as CLKC clock, which if provided to an optional programmable delay cell 516 and one or more flip-flops 520.

On the other hand, the multiplexer 510 receives the delayed CLKin clock from the clock buffer cell 502 as an input. When selected by the SEL signal in a low clock speed mode, the multiplexer 510 outputs the delayed CLKin clock to a second set of buffers 514. The buffers 514 are preferably arranged in a clock tree distribution arrangement and further delays the CLKin clock by, for example, 2 ns. The buffers 514 then outputs the delayed CLKin clock as PCLKO clock, which is provided to one or more I/O cells such as a latch, flip-flop, etc. It should be noted that CLKC and CLKO clocks may be distributed to any suitable number of circuit elements such as flip-flops, I/O cells, etc.

In the feedback path of the PLL 504, the programmable delay cell 516 outputs the CLKC clock to a delay element 524 (e.g., latch, flip-flop, buffer, etc.) with a delay that is configured to compensate for different delay times of clock buffer cell 502 and the delay element 524. Preferably, the programmable delay cell 516 provides a delay that is equal to the delay of the clock buffer cell 502 in response to a PLL tweak signal PLLTWEAK1, which provides a negative delay. The delayed CLKC clock from the buffer 524 is then provided to the PLL 504 in a feedback configuration. In this configuration, the PLL 504 functions to align the CLKC clock to the CLKin clock.

When the delays of the delay element 524 and the clock buffer cell 502 match, the programmable delay cell 516 need not delay the CLKC clock. By way of example, if the clock buffer cell 502 and delay element 524 each provide a 5 ns delay, the programmable delay cell does not provide a delay to the CLKC clock. This is because the CLKin clock and the CLKC clock input to the PLL will align properly in this case.

However, when the delays of the clock buffer cell 502 and delay element 524 do not match, the PLLTWEAK1 signal may also be used to fine tune the programmable delay cell 516 so that the CLKC clock input to the PLL 504 aligns properly with the input CLKin clock. For example, if the delays of the clock buffer cell 502 and delay element 524 are 5 ns and 4.5 ns, respectively, the programmable delay cell 516 can be configured to provide a compensating delay such as 0.5 ns, 5.5 ns, etc. to match the delay of the clock buffer cell 502. In this manner, the programmable delay cell 516 provides a fine-tuned compensating delay through the feedback path so that the CLKC clock to the PLL 504 aligns properly with the input CLKin clock.

To synchronize the operation of one or more I/O cells 518 (e.g., flip-flops, latches, etc.), the PLLout signal from the PLL 504 is also provided to the programmable delay cell 506. The programmable delay cell 506 is configured to match the delay of the buffers 512 with the delay of the buffers 514 in response to a PLL tweak signal PLLTWEAK2, which provides a delay between CLKC and CLKO. For example, when the delays of the buffers 512 and 514 are 5 ns and 2 ns, respectively, the programmable delay cell 506 provides a delay of 3 ns so that the output CLKC and CLKO clocks align to each other when operating in the higher clock mode. Furthermore, since the PLL 504 aligns the delayed CLKC and CLKin clocks, all three clocks CLKC, CLKO, and CLKin are aligned properly.

In one embodiment, the set of buffers 512 outputs CLKC clock to one or more flip-flops 520 in a logic circuit 522. The logic circuit 522, which may include memory units such as registers, may be core logic 406 described above, a clock interface circuit, or any other logic circuits that require synchronous timing for proper operation. By way of example, when used as core logic 406 that receives data such as data, address, control signals, the logic circuit 522 outputs the data to the I/O cell 518. The I/O cell 518 then outputs the data in response to the CLKO clock from the buffers 514.

The dual mode clock alignment and distribution device 500 thus accommodates different clock requirements to provide CLKC and CLKO clocks that are substantially aligned to input clock CLKin. For example, in conventional PCI mode running at a clock speed up to 66 Mhz, where conventional PLL is not well suited, the delayed CLKin clock from the clock buffer cell 502 is provided to multiplexers 508 and 510. In response to SEL signal indicating the slower clock mode, multiplexers 508 and 510 feed the delayed CLKin clock from the clock buffer cell 502 to the buffers 512 and 514. It should be noted that the SEL signal may also be provided to the PLL 504 to disable the PLL 504. Thus, the PLL 504 is effectively bypassed in this slower clock mode. As a result however, the clocks CLKC, CLKO, and CLKin are not aligned. However, for lower speed such as 66 Mhz and lower, the delays provide sufficient margin for proper operation of lower speed devices such as conventional PCI devices.

Figure 6:
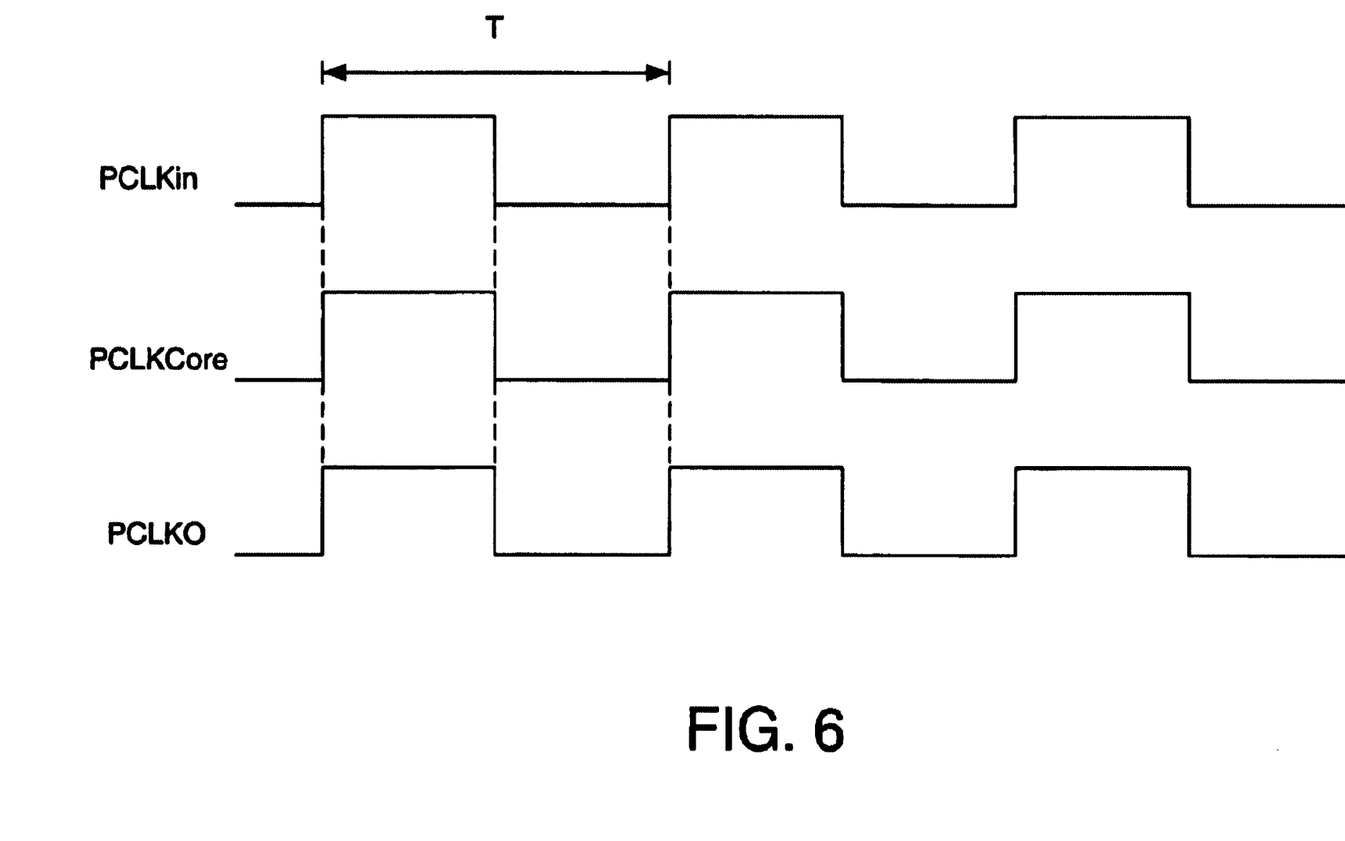
FIG. 6 illustrates a timing diagram of CLKin, CLKO, and CLKC clocks in alignment when operating in a higher clock speed.

On the other hand, when operating in PCI-X mode running at a clock speed of over 66 Mhz, the PLL 504 is used to align CLKC and CLKin clocks. Specifically, in a higher clock mode, the PLLout signal from the PLL 504 is provided to the multiplexer 510 by way of programmable delay cell 506 and to the multiplexer 508. The programmable delay cell 506 then outputs the PLLout signal to the multiplexer 510 with a delay that is designed to match the delay of the buffers 514 to the delay of the buffers 512. The matching delay and the alignment of CLKC and CLKin clocks by the PLL 504 thereby ensure alignment of CLKO, CLKC, and CLKin clock edges when operating in the higher clock speed as shown in FIG. 6.

The clock alignment and distribution devices of the present invention thus support both a lower speed clocking mode such as PCI clock mode and a higher speed clocking mode such as PCI-X clock mode. In the higher clock mode, the dual mode clock alignment and distribution devices use the PLL to provide aligned clocks. When operating in the lower clock speed mode, on the other hand, the clock alignment and distribution devices bypasses the PLL and generates clocks with sufficient margin to accommodate the requirements of the lower clock speed. Accordingly, the clock alignment and distribution devices thus provide full backward compatibility with conventional PCI devices. In so doing, the dual mode clock alignment and distribution devices provide substantial savings in cost while reducing circuit complexity.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A dual mode clock alignment device, comprising:
   a clock buffer cell arranged to receive a first clock, the clock buffer cell delaying the first clock;
   a PLL arranged to receive the delayed first clock from the clock buffer, the PLL being configured to output a second clock; and
   a first set and a second set of buffers arranged to receive the delayed first clock from the clock buffer cell for operating in a first clock mode, the first and second sets of buffers being further arranged to receive the second clock from the PLL for operating in a second clock mode, wherein the first set of buffers delays the received clock by a first delay to output a third clock and the second set of buffers delays the delayed clock by a second delay to output a fourth clock, and wherein the first, third, and fourth clocks are all aligned when operating in the second clock mode.

2. The dual mode clock alignment device as recited in claim 1, further comprising:
   a first delay cell coupled to receive the second clock from the PLL, the first delay cell delaying the received second clock by a third delay such that the second delay and the third delay match the first delay when operating in the second clock mode.

3. The dual mode clock alignment device as recited in claim 2, wherein the first clock speed is higher when operating in the second clock mode than when operating in the first clock mode.

4. The dual mode clock alignment device as recited in claim 3, wherein the first clock mode is a PCI mode and the second clock mode is a PCI-X mode.

5. The dual mode clock alignment device as recited in claim 3, further comprising:
   a first multiplexer coupled to receive the second clock from the PLL and the delayed first clock from the clock buffer cell as inputs, wherein the first multiplexer outputs the delayed first clock to the first set of buffers when operating in the first mode and wherein the first multiplexer outputs the second clock to the first set of buffers when operating in the second mode; and
   a second multiplexer coupled to receive the delayed second clock from the first delay cell and the delayed first clock from the clock buffer cell as inputs, wherein the second multiplexer outputs the delayed first clock to the second set of buffers when operating in the first mode and wherein the second multiplexer outputs the delayed second clock to the second set of buffers when operating in the second mode.

6. The dual mode clock alignment device as recited in claim 5, further comprising:
   a delay element coupled to receive the third clock from the first set of buffers, the delay element delaying the third clock by a delay equal to the clock buffer cell, wherein the delay element feeds the delayed third clock to the PLL.

7. The dual mode clock alignment device as recited in claim 6, further comprising:
   a second delay cell configured to receive the third clock from the first set of buffers, wherein the second delay cell delays the third clock to match the delay of the delay element to the delay of the clock buffer cell.

8. The dual mode clock alignment device as recited in claim 7, wherein the first and second delay cells are programmable.

9. The dual mode clock alignment device as recited in claim 2, further comprising:
   a logic circuit having a set of flip-flops and being arranged to receive and output data and address in response to the third clock; and
   an output flip-flop coupled to receive the data and address from the logic circuit to output the data and address in response to the fourth clock.

10. The dual mode clock alignment device as recited in claim 9, wherein the logic circuit is a core logic.

11. A dual mode PCI adapter device for interfacing between a PCI bus and a PCI device, comprising:
    a clock buffer cell arranged to receive a first clock, the clock buffer cell delaying the first clock;
    a PLL arranged to receive the delayed first clock from the clock buffer, the PLL being configured to output a second clock;
    a first set and a second set of buffers arranged to receive the delayed first clock from the clock buffer cell for operating in a PCI mode, the first and second sets of buffers being further arranged to receive the second clock from the PLL for operating in a PCI-X mode, wherein the first set of buffers delays the received clock by a first delay to output a third clock and the second set of buffers delays the received clock by a second delay to output a fourth clock, and wherein the first, third, and fourth clocks are all aligned when operating in the PCI-X mode;
    a core logic having a set of flip-flops and being arranged to receive and output data and address from the PCI bus in response to the third clock; and
    an output flip-flop coupled to receive the data from the logic circuit to output the data to the PCI device in response to the fourth clock.

12. The dual mode PCI adapter device as recited in claim 11, further comprising:
    a first delay cell coupled to receive the second clock from the PLL, the first delay cell delaying the received second clock by a third delay such that the second delay and the third delay match the first delay when operating in the PCI-X mode.

13. The dual mode PCI adapter device as recited in claim 12, wherein the first clock speed is higher when operating in the second clock mode than when operating in the PCI mode.

14. The dual mode PCI adapter device as recited in claim 13, further comprising:

a first multiplexer coupled to receive the second clock from the PLL and the delayed first clock from the clock buffer cell as inputs, wherein the first multiplexer outputs the delayed first clock to the first set of buffers when operating in the PCI mode and wherein the first multiplexer outputs the second clock to the first set of buffers when operating in the second mode; and a second multiplexer coupled to receive the delayed second clock from the first delay cell and the delayed first clock from the clock buffer cell as inputs, wherein the second multiplexer outputs the delayed first clock to the second set of buffers when operating in the PCI mode and wherein the second multiplexer outputs the delayed second clock to the second set of buffers when operating in the PCI-X mode.

15. The dual mode PCI adapter device as recited in claim 14, further comprising:

a delay element coupled to receive the third clock from the first set of buffers, the delay element delaying the third clock by a delay equal to the clock buffer cell, wherein the delay element feeds the delayed third clock to the PLL.

16. The dual mode PCI adapter device as recited in claim 6, further comprising:

a second delay cell configured to receive the third clock from the first set of buffers, wherein the second delay cell delays the third clock to match the delay of the delay element to the delay of the clock buffer cell.

17. The dual mode PCI adapter device as recited in claim 16, wherein the first and second delay cells are programmable.

18. The dual mode PCI adapter device as recited in claim 11, wherein the first clock operates at a speed up to 66 Mhz in the PCI mode and wherein the first clock operates at a speed higher than 66 Mhz in the PCI-X mode.

19. A dual mode clock alignment and distribution device, comprising:

a clock buffer cell arranged to receive a first clock, the clock buffer cell being adapted to delay the first clock;

a PLL arranged to receive the delayed first clock from the clock buffer, the PLL being configured to output a second clock; and a first set and a second set of buffers arranged to receive the delayed first clock from the clock buffer cell for operating in a first clock mode, the first and second sets of buffers being further arranged to receive the second clock from the PLL for operating in a second clock mode, wherein the first set of buffers delays the received clock by a first delay to output a third clock and the second set of buffers delays the delayed clock by a second delay to output a fourth clock, and wherein the first, third, and fourth clocks are all aligned when operating in the second clock mode;

a logic circuit having a set of flip-flops and being arranged to receive and output data and address in response to the third clock; and a set of I/O cells coupled to receive the data and address from the logic circuit to output the data and address in response to the fourth clock.

20. The dual mode clock alignment and distribution device as recited in claim 19, further comprising:

a first delay cell coupled to receive the second clock from the PLL, the first delay cell delaying the received second clock by a third delay such that the second delay and the third delay match the first delay when operating in the second clock mode.

21. The dual mode clock alignment and distribution device as recited in claim 19, wherein the first clock speed is higher when operating in the second clock mode than when operating in the first clock mode.

22. The dual mode clock alignment and distribution device as recited in claim 19, wherein the first clock mode is a PCI mode and the second clock mode is a PCI-X mode.

23. The dual mode clock alignment and distribution device as recited in claim 20, further comprising:

a first multiplexer coupled to receive the second clock from the PLL and the delayed first clock from the clock buffer cell as inputs, wherein the first multiplexer outputs the delayed first clock to the first set of buffers when operating in the first mode and wherein the first multiplexer outputs the second clock to the first set of buffers when operating in the second mode; and a second multiplexer coupled to receive the delayed second clock from the first delay cell and the delayed first clock from the clock buffer cell as inputs, wherein the second multiplexer outputs the delayed first clock to the second set of buffers when operating in the first mode and wherein the second multiplexer outputs the delayed second clock to the second set of buffers when operating in the second mode.

24. The dual mode clock alignment and distribution device as recited in claim 23, further comprising:

a delay element coupled to receive the third clock from the first set of buffers, the delay element delaying the third clock by a delay equal to the clock buffer cell, wherein the delay element feeds the delayed third clock to the PLL.

25. The dual mode clock alignment and distribution device as recited in claim 24, further comprising:

a second delay cell configured to receive the third clock from the first set of buffers, wherein the second delay cell delays the third clock to match the delay of the delay element to the delay of the clock buffer cell.

26. The dual mode clock alignment and distribution device as recited in claim 25, wherein the first and second delay cells are programmable.

* * * * *